(12) United States Patent
Shiu

(10) Patent No.: US 9,536,831 B2
(45) Date of Patent: Jan. 3, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventor: Jian-Bin Shiu, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/789,994

(22) Filed: Jul. 2, 2015

(65) Prior Publication Data

US 2016/0336265 A1    Nov. 17, 2016

(30) Foreign Application Priority Data

May 12, 2015    (CN) .......................... 2015 1 0237821

(51) Int. Cl.
| | | |
|---|---|---|
| *H01L 23/48* | (2006.01) | |
| *H01L 23/544* | (2006.01) | |
| *H01L 23/02* | (2006.01) | |
| *H01L 21/50* | (2006.01) | |
| *H01L 23/528* | (2006.01) | |
| *H01L 23/00* | (2006.01) | |
| *H01L 21/768* | (2006.01) | |
| *H01L 21/56* | (2006.01) | |
| *H01L 21/78* | (2006.01) | |
| *H01L 23/522* | (2006.01) | |
| *H01L 23/31* | (2006.01) | |
| *H01L 27/146* | (2006.01) | |

(52) U.S. Cl.
CPC ............ *H01L 23/528* (2013.01); *H01L 21/56* (2013.01); *H01L 21/76802* (2013.01); *H01L 21/76877* (2013.01); *H01L 21/78* (2013.01); *H01L 23/3171* (2013.01); *H01L 23/5226* (2013.01); *H01L 24/03* (2013.01); *H01L 24/05* (2013.01); *H01L 27/1464* (2013.01); *H01L 27/14634* (2013.01); *H01L 2224/0502* (2013.01)

(58) Field of Classification Search
CPC ............... H01L 23/528; H01L 23/5226; H01L 23/3171; H01L 24/03; H01L 24/05; H01L 27/1464; H01L 27/14634
USPC ........ 438/460, 462, 676, 710; 257/499, 690, 257/734, 774, E21.505, E21.507, E21.508, 257/E21.531, E23.021, E23.114, E23.146; 324/763
See application file for complete search history.

(56) References Cited

U.S. PATENT DOCUMENTS

| | | | |
|---|---|---|---|
| 6,915,795 B2 | 7/2005 | Brouillette et al. | |
| 7,547,630 B2 | 6/2009 | Gerber | |
| 8,106,488 B2* | 1/2012 | Chua ................. | H01L 21/76898 257/662 |
| 8,115,306 B2* | 2/2012 | Poo ......................... | H01L 21/78 257/723 |

(Continued)

FOREIGN PATENT DOCUMENTS

EP    0032801    7/1981

OTHER PUBLICATIONS

F.J. Foo et al., Failure Analysis of Die Crack in Lidless Packages, 2010 IEEE.

(Continued)

*Primary Examiner* — Dao H Nguyen
(74) *Attorney, Agent, or Firm* — Winston Hsu; Scott Margo

(57) ABSTRACT

A semiconductor device is disclosed. The semiconductor device includes: a substrate having a die region and a scribe (Continued)

line region defined thereon; and a bonding pad on the die region of the substrate and overlapping the scribe line region.

19 Claims, 5 Drawing Sheets

(56) References Cited

U.S. PATENT DOCUMENTS

| | | | | |
|---|---|---|---|---|
| 8,555,495 | B2* | 10/2013 | Chia | H01L 21/6835 |
| | | | | 174/260 |
| 8,592,950 | B2* | 11/2013 | Pagaila | H01L 21/6835 |
| | | | | 257/521 |
| 9,263,488 | B2* | 2/2016 | Kataoka | H01L 27/14634 |
| 9,293,441 | B2* | 3/2016 | Hoshino | H01L 25/0657 |
| 9,331,002 | B2* | 5/2016 | Pagaila | H01L 21/50 |
| 2003/0006795 | A1* | 1/2003 | Asayama | H01L 22/34 |
| | | | | 324/750.3 |
| 2004/0110365 | A1 | 6/2004 | Su et al. | |
| 2004/0157410 | A1* | 8/2004 | Yamaguchi | H01L 23/49805 |
| | | | | 438/460 |
| 2007/0039923 | A1* | 2/2007 | Kim | C23F 4/00 |
| | | | | 216/67 |
| 2007/0102791 | A1 | 5/2007 | Wu | |
| 2008/0169533 | A1 | 7/2008 | Jeng et al. | |
| 2010/0078769 | A1 | 4/2010 | West et al. | |

OTHER PUBLICATIONS

Annette Teng Cheung, Dicing Advanced Materials for Microelectronics, 2005 IEEE.

S. Abdullah et al., Step Cut for Dicing Laminated Wafer in a QFN Package, Solid State Science and Technology, vol. 16, No. 2 (2008) 198-206.

Ramon J. Albalak et al., Quality and Reliability Aspects in the Singulation of Complex Wafers Containing Low-k, Copper and TEGs in the Streets, Advanced Dicing Technologies, Jul. 31, 2006.

* cited by examiner

US 9,536,831 B2

SEMICONDUCTOR DEVICE AND METHOD FOR FABRICATING THE SAME

BACKGROUND OF THE INVENTION

1. Field of the Invention

The invention relates to a semiconductor device, and more particularly, to a bonding pad structure overlapping die region and scribe line region.

2. Description of the Prior Art

Today the functionality and economics of many consumer products are being transformed by "system-on-chip" (SoC) technology. The continuing increase in the transistor densities means that it is now possible to integrate the processor, peripherals and some or all of the system memory on a single chip.

SoC is an idea of integrating all components of a computer or other electronic system into a single integrated circuit chip. It may contain micro processing core, MPEG core, memory, digital/analog circuits, mixed-signal circuits, and often radio-frequency functions—all on one chip. SoC is believed to be more cost effective since it increases the yield of the fabrication and also its packaging is less complicated.

In the design of SoC, the height difference between chip and substrate plays a critical role in the wire bonding process afterwards. Typically, after chip is fabricated a procedure is carried out to extend circuits from the chip to a lower surface of the substrate through re-distribution layer (RDL) for wire bonding process conducted afterwards. This approach not only increases the difficulty of the process but also consumes time and cost significantly. Hence, how to provide a more simplified design of the current architecture has become an important task in this field.

SUMMARY OF THE INVENTION

According to a preferred embodiment of the present invention, a method for fabricating semiconductor device is disclosed. The method includes the steps of: providing a substrate having a die region and a scribe line region; and forming a bonding pad on the die region of the substrate and overlapping the scribe line region.

According to another aspect of the present invention, a semiconductor device is disclosed. The semiconductor device includes: a substrate having a die region and a scribe line region defined thereon; and a bonding pad on the die region of the substrate and overlapping the scribe line region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
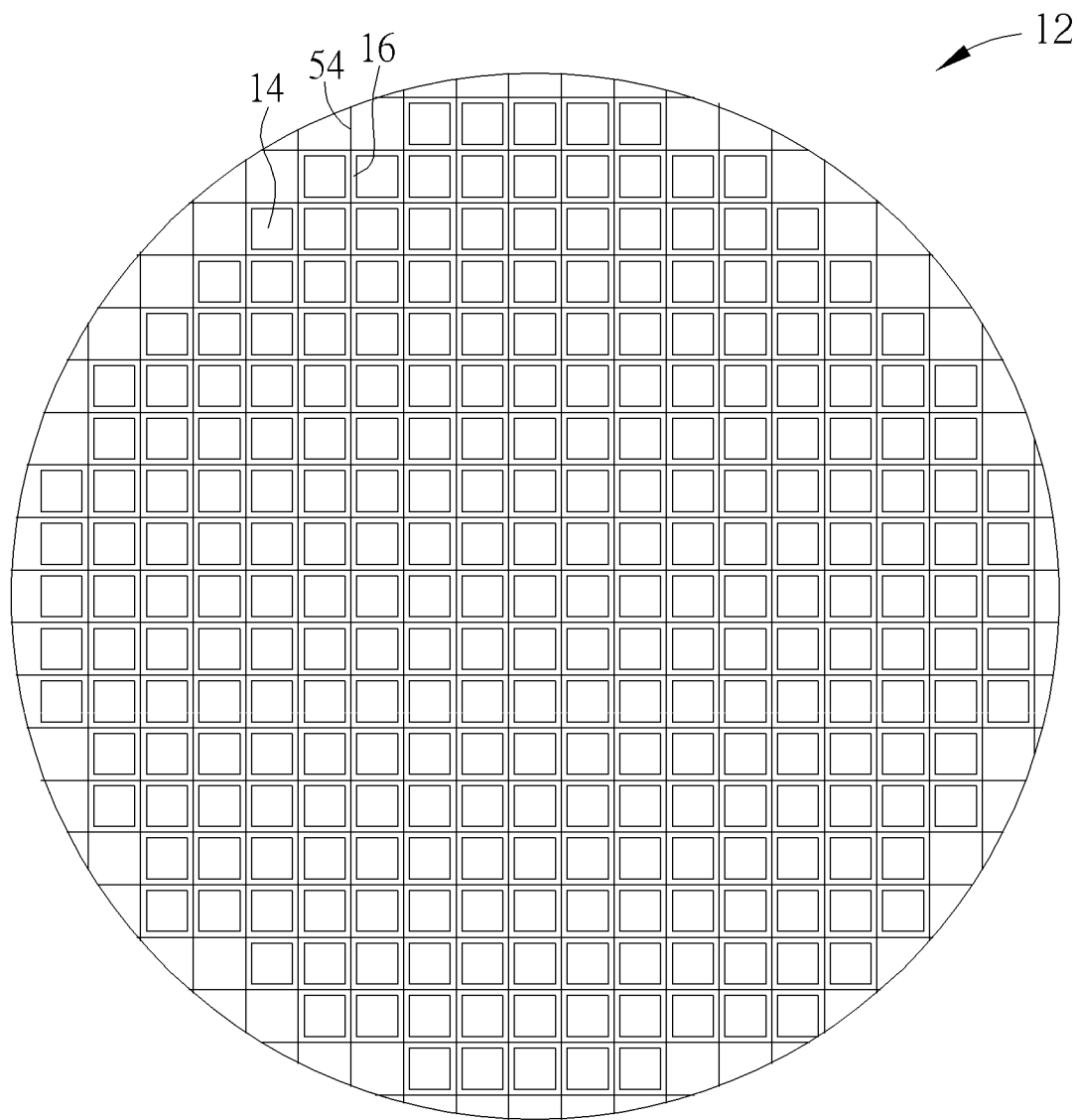
FIG. 1 illustrates a perspective view of a semiconductor wafer according to a preferred embodiment of the present invention.
Figure 2:
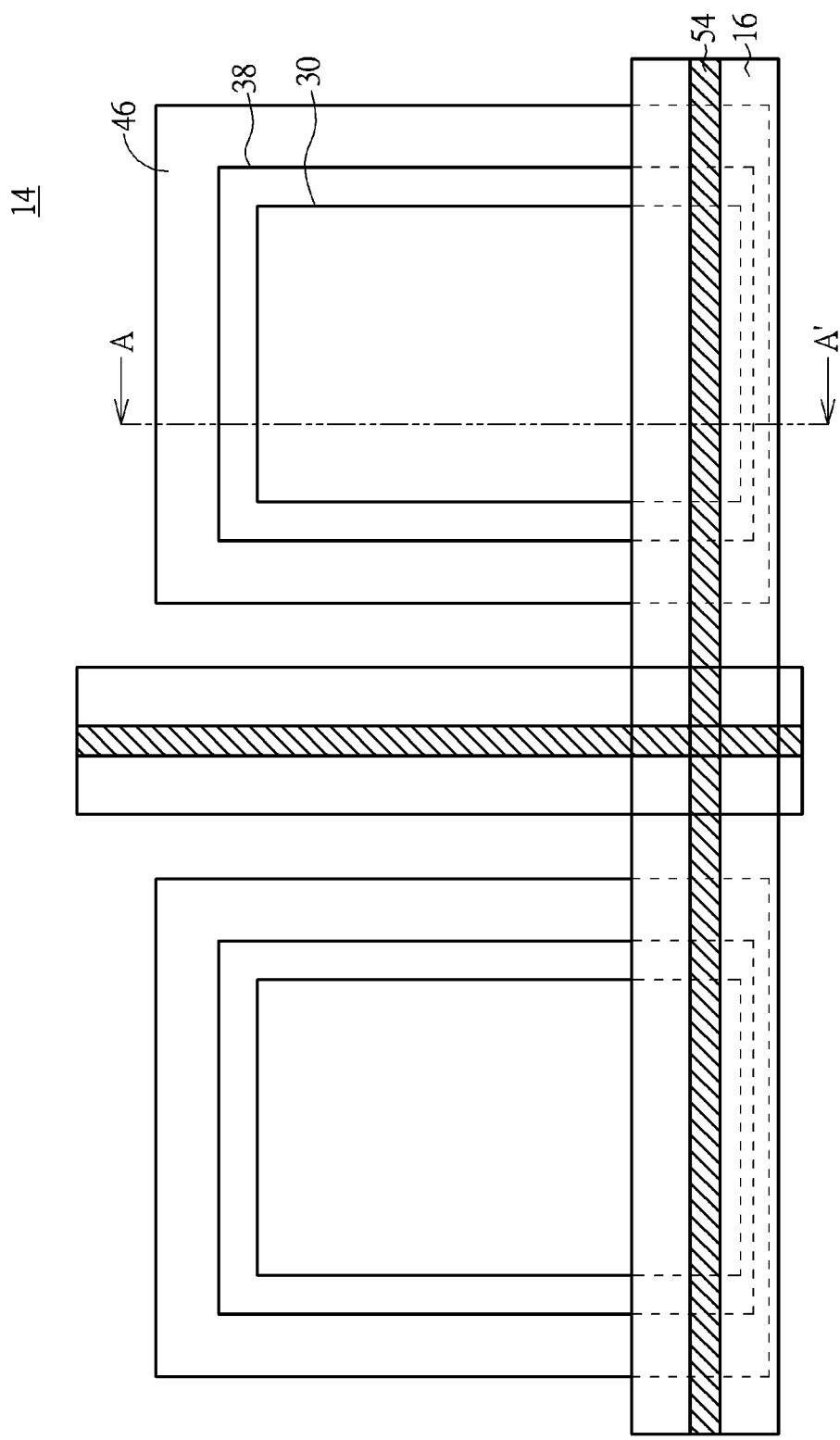
FIG. 2 illustrates a partial view of a bonding pad and scribe line region from FIG. 1.
Figure 3:
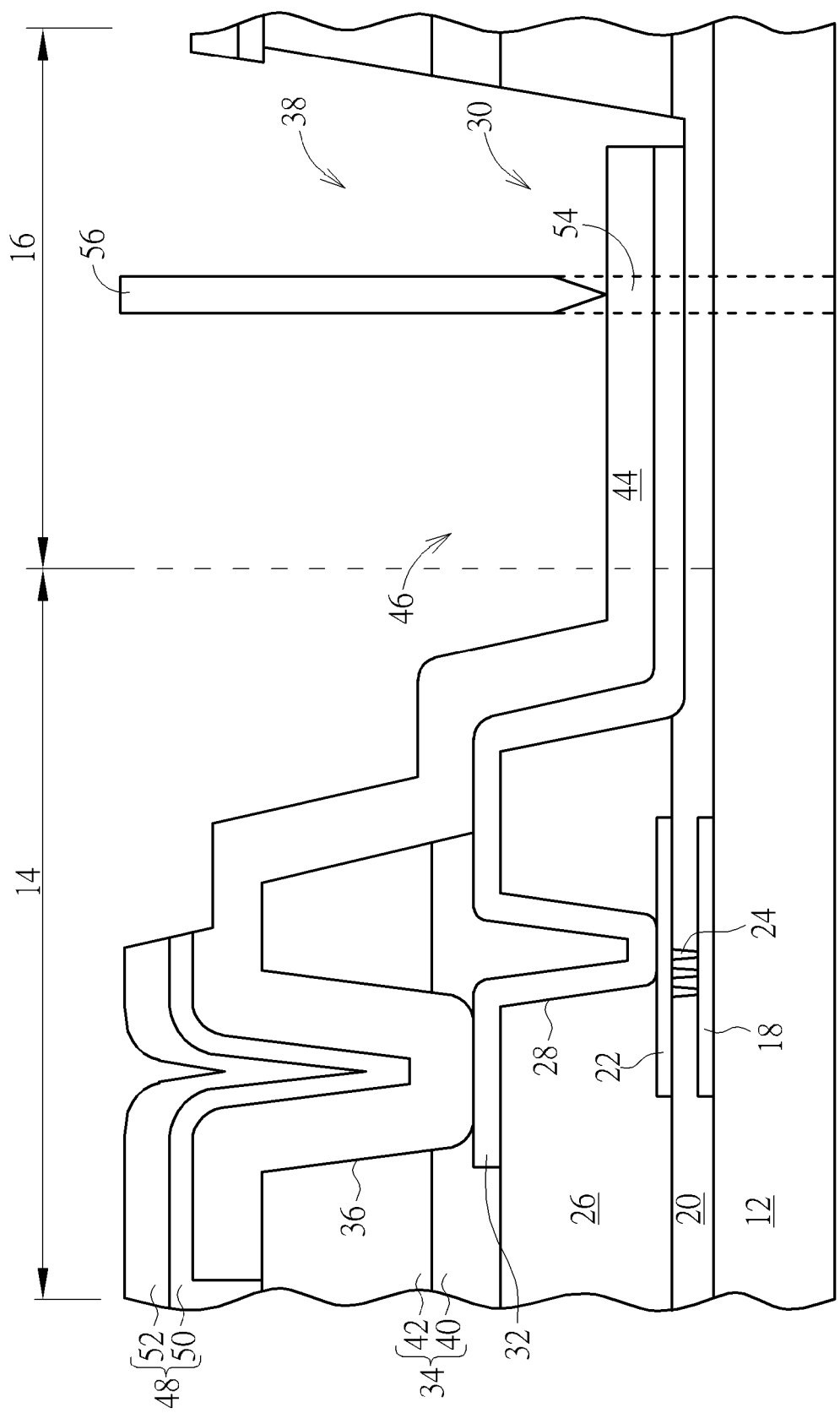
FIG. 3 illustrates a cross-sectional view of FIG. 2 along the sectional line AA'.
Figure 4:
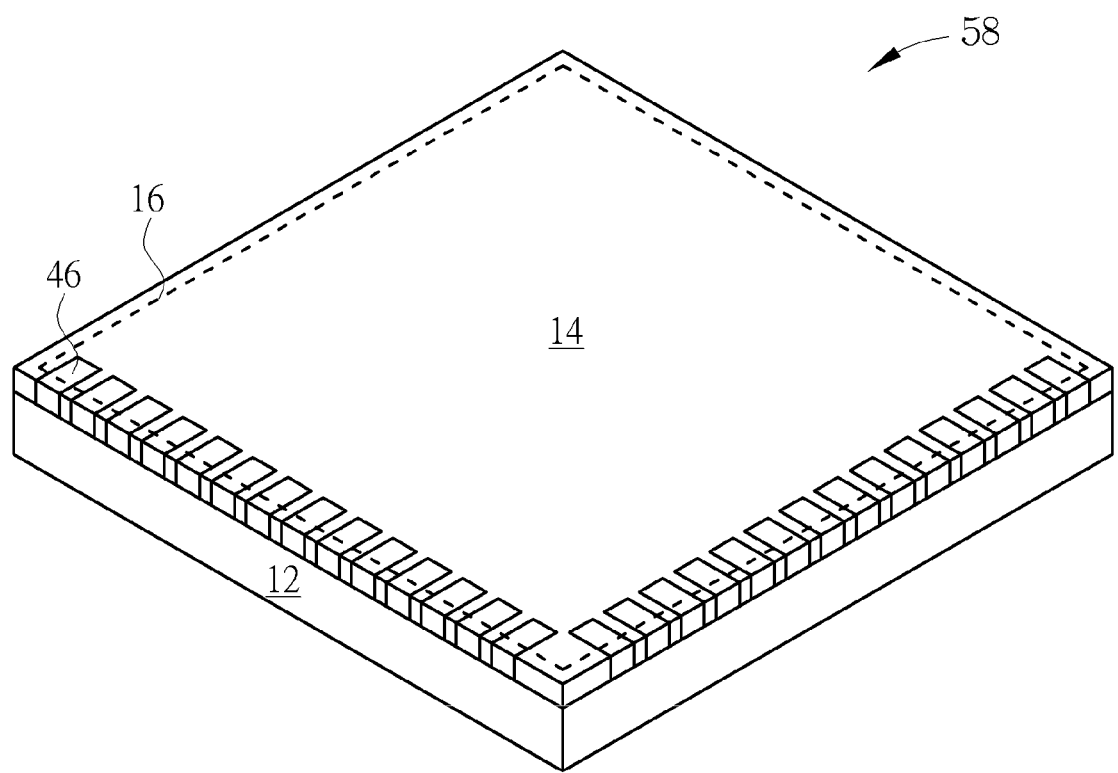
FIG. 4 illustrates a three-dimensional view of a semiconductor die according to a preferred embodiment of the present invention.

Referring to FIGS. 1-4, FIG. 1 illustrates a perspective view of a semiconductor wafer according to a preferred embodiment of the present invention, FIG. 2 illustrates a partial view of a bonding pad and scribe line region from FIG. 1, FIG. 3 illustrates a cross-sectional view of FIG. 2 along the sectional line AA', and FIG. 4 illustrates a three-dimensional view of a semiconductor die according to a preferred embodiment of the present invention. As shown in FIGS. 1-4, a substrate 12 or semiconductor chip is provided, in which the substrate 12 could be a semiconductor wafer or substrate composed of semiconductor material. For instance, the substrate 12 could be selected from the group consisting of silicon, germanium, silicon germanium compounds, silicon carbide, and gallium arsenide.

At least a die region 14 and a scribe line region 16 are defined on the substrate 12, in which each of the die regions 14 includes integrated circuits fabricated therein. The scribe line region 16 is formed surrounding the die region 14, and a die seal ring (not shown) could also be formed between the scribe line region 16 and die region 14 depending on the demand of the product, which is also within the scope of the present invention.

Active devices such as metal-oxide semiconductor (MOS) transistors, passive devices, conductive layers, and interlayer dielectric (ILD) layer (not shown) could also be formed on top of the substrate 12. More specifically, planar MOS transistors or non-planar (such as FinFETs) MOS transistors could be formed on the substrate 12, in which the MOS transistors could include transistor elements such as metal gates and source/drain region, spacer, epitaxial layer, and contact etch stop layer (CESL). The ILD layer could be formed on the substrate 12 and covering the MOS transistors, and a plurality of contact plugs could be formed in the ILD layer to electrically connect the gate and/or source/drain region of MOS transistors to upper level wirings or external devices through wiring such as metal layer 18. Since the fabrication of planar or non-planar transistors and ILD layer is well known to those skilled in the art, the details of which are not explained herein for the sake of brevity.

Next, a first inter-metal dielectric (IMD) layer 20 formed on the substrate 12 and covering the ILD layer and metal layer 18, and another metal layer 22 is formed on the first IMD layer 20 and electrically connected to the metal layer 18 through contact plugs 24. In this embodiment, the first IMD layer 20 is composed of silicon oxide and the thickness of the first IMD layer 20 is approximately 10000 Angstroms, and the thickness of each of the metal layer 18 and metal layer 22 is about 5000 Angstroms.

Next, a second IMD layer 26 is formed on the first IMD layer 20, and a photo-etching process is conducted to remove part of the second IMD layer 26 on both die region 14 and scribe line region 16 to form a via opening 28 exposing the metal layer 22 surface and another via opening 30 exposing part of the first IMD layer 20 between the die region 14 and scribe line region 16. In this embodiment, the second IMD layer 26 is preferably composed of silicon oxide, and the thickness of the second IMD layer 26 is about 50000 Angstroms.

Next, a metal layer 32 is deposited on the second IMD layer 26 and filled into the via opening 28 and via opening 30, in which the metal layer 32 filled into the via opening 30 preferably extends from the top surface of second IMD layer 26 on die region 14 to the sidewall of second IMD layer 26 and top surface of first IMD layer 20 on scribe line region 16. In other words, the metal layer 32 pattern preferably overlaps part of the die region 14 and the scribe line region 16 simultaneously, in which the thickness of the metal layer 32 is about 8000 Angstroms.

Next, a third IMD layer 34 is deposited on the second IMD layer 26 and metal layer 32, and a photo-etching process is conducted to remove part of the third IMD layer 34 for forming a via opening 36 exposing the metal layer 32 surface on die region 14 and another via opening 38 exposing part of the metal layer 32 on both scribe line region 14 and die region 16. In this embodiment, the third IMD layer 34 is preferably a composite structure composed of a silicon oxide layer 40 and a silicon nitride layer 42, in which the thickness of the silicon oxide layer 40 is about 10000 Angstroms while the thickness of the silicon oxide layer 42 is about 50000 Angstroms.

Next, a metal layer 44 is formed on the third IMD layer 34 and filled into the via opening 36 and via opening 38, in which the metal layer 44 filled into the via opening 38 preferably extends from the third IMD layer 34 surface to the sidewall of third IMD layer 34 and top surface of the metal layer 32 on scribe line region 16. As shown in the figures, the metal layer 44 pattern preferably contacts the metal layer 32 pattern directly and overlaps the die region 14 and scribe line region 16. In this embodiment, the thickness of the metal layer 44 is about 20000 Angstroms, and the metal layer 44 and metal layer 32 extending from the die region 14 to the scribe line region 16 are preferably form a bonding pad 46 of the semiconductor device. According to other embodiments of the present invention, it would also be desirable to extend the metal layer 18 and metal layer 22 from the die region 14 to the scribe line region 16 so that the metal layers 44, 32, 22, and 18 could form the bonding pad altogether. In addition, the bonding pad 46 could also be consisted of only a single metal layer 44, a single metal layer 32, a single metal layer 22, or a single metal layer 18, and the thickness of the bonding pad 46 it to be maintained greater than 25000 Angstroms.

Next, a passivation layer 48 is formed on the third IMD layer 34 and metal layer 44, and a photo-etching process is conducted to remove part of the passivation layer 48 from metal layer 44 surface, particularly the passivation layer 48 disposed on scribe line region 16 and part of the die region 14. In this embodiment, the passivation layer 48 is preferably a composite structure composed of a silicon oxide layer 50 and a silicon nitride layer 52, in which the thickness of the silicon oxide layer 50 is about 6000 Angstroms and the thickness of the silicon nitride layer 52 is about 10000 Angstroms. A dicing process could be conducted thereafter by using a diamond dicing tool 56 to separate the substrate 12 into plurality of dies along the die saw path or dicing path 54 in the scribe line region 16. The dies formed are then ready for follow-up packaging process. It should be noted that since both the metal layers 44 and 32 used as bonding pad 46 and the first IMD layer 20 underneath all extend from the die region 14 to the scribe line region 16, the metal layers 44 and 32 and the first IMD layer 20 would all be diced along with the substrate 12 during the aforementioned dicing process to form into a die 58 as shown in FIG. 4. Preferably, the diced edge of each bonding pad 46 would be aligned with the diced edge of the die 58.

Referring again to FIGS. 1-4, in which a semiconductor device structure is further disclosed. The semiconductor device preferably includes a substrate 12 and a bonding pad 46 disposed on the substrate 12 while overlapping both the die region 14 and scribe line region 16 on the substrate 12. Specifically, a first IMD layer 20 is covered on active devices and ILD layer on the substrate 12, a second IMD layer 26 is disposed on the first IMD layer 20, a via opening 28 and via opening 30 are formed in the second IMD layer 26, a metal layer 32 is disposed on the second IMD layer 26 and filled into the via openings 28 and 30, a third IMD layer 34 is disposed on the second IMD layer 26 and metal layer 32, a via opening 36 and via opening 38 are formed in the third IMD layer 34, a metal layer 44 is disposed on the third IMD layer 34 and filled into the via openings 36 and 38, and a passivation layer 48 is disposed on the third IMD layer 34. The metal layers 32 and 44 are preferably selected from the group consisting of Al, Ti, Ta, W, Nb, Mo, and Cu, and most preferably Al, but not limited thereto.

It should be noted that in this embodiment, both the via opening 30 and via opening 38 are formed to overlap part of the die region 14 and scribe line region 16 so that the metal layers 32 and 44 formed in the via openings 30 and 38 also overlap the die region 14 and scribe line region 16, in which the exposed metal layer 44 preferably serving as the bonding pad 46 of the semiconductor device. By forming the via openings 30 and 38 to overlap both die region 14 and scribe line region 16, it would be desirable to reduce the thickness of IMD layer on scribe line region 16 thereby preventing phenomenon including delamination, cracking, or peeling caused during dicing process. In addition, the vertical distance from the top surface of the passivation layer 48 to the top surface of the bonding pad 46 overlapping scribe line region 16 is preferably greater than 15 μm, and the distance of the bonding pad 46 overlapping the scribe line region 16 is larger than 150 μm.

Figure 5:
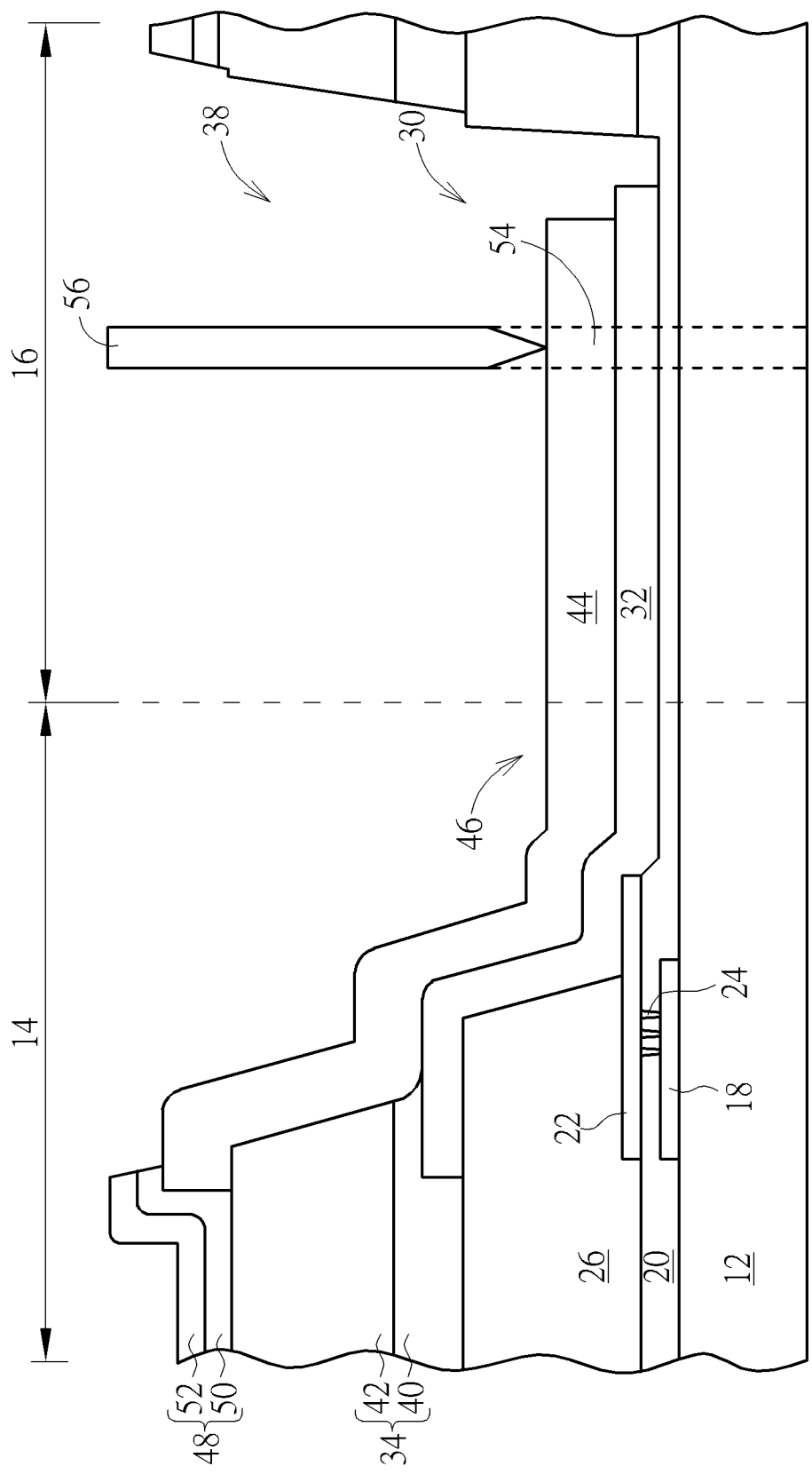
FIG. 5 illustrates a cross-sectional view of a semiconductor device according to another embodiment of the present invention.

Referring to FIG. 5, FIG. 5 illustrates a cross-sectional view of a semiconductor device according to another embodiment of the present invention. Similar to the aforementioned embodiment, a first IMD layer 20, second IMD layer 26, third IMD layer 34, and passivation layer 48 are sequentially formed on the substrate 12 and ILD layer, a via opening 30 is formed in the second IMD layer 26, a via opening 38 is formed in the third IMD layer 34, and metal layers 32 and 44 overlapping die region 14 and scribe line region 16 are formed in the via openings 30 and 38 to constitute a bonding pad 46. In contrast to the aforementioned embodiment, only one single via opening 30 and one single via opening 38 overlapping die region 14 and scribe line region 16 are formed in the second IMD layer 26 and third IMD layer 34 respectively to provide a much simpler wiring layout.

Overall, the present invention provides an improved bonding pad structure by extending metal layers or metal patterns from the die region to the scribe line region, in which the metal layers are preferably metal wirings formed above MOS transistors and ILD layers during fabrication of metal interconnections. By doing so, the metal patterns would overlap the die region and scribe line region simultaneously and the metal layer or metal pattern exposed on the scribe line region is preferably used as bonding pad for packaging process conducted afterwards. Since the metal pattern or re-distribution layer (RDL) pattern of the present invention is extended from a substantially higher die region to a substantially lower scribe line region to form a bonding pad directly, it would be desirable to eliminate the need of conducting an extra process to form RDL patterns for connecting circuits from the chip, which not only lowers the complexity of the fabrication process but also reduces overall cost significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a die region and a scribe line region;
   forming a first inter-metal dielectric (IMD) layer on the substrate;
   forming a second IMD layer on the first IMD layer;
   forming a first metal layer on the second IMD layer, wherein the first metal layer covers a sidewall of the second IMD layer and extends to the scribe line region; and
   forming a second metal layer on the first metal layer.

2. The method of claim 1, further comprising:
   forming a first via opening in the second IMD layer;
   forming the first metal layer on the second IMD layer and into the first via opening;
   forming a third IMD layer on the second IMD layer and the first metal layer;
   forming a second via opening in the third IMD layer;
   forming the second metal layer on the third IMD layer and into the second via opening; and
   forming a passivation layer on the third IMD layer and part of the second metal layer.

3. The method of claim 2, further comprising forming the first via opening on the die region and the scribe line region.

4. The method of claim 3, wherein the first via opening on the scribe line region exposes the first IMD layer.

5. The method of claim 1, wherein the first metal layer overlaps the die region and the scribe line region.

6. The method of claim 2, further comprising forming the second via opening on the die region and the scribe line region.

7. The method of claim 2, wherein the second via opening on the scribe line region exposes the first metal layer.

8. The method of claim 2, wherein the second metal layer overlaps the die region and the scribe line region for forming a bonding pad.

9. The method of claim 8, wherein second metal layer on the scribe line region contacts the first metal layer directly.

10. The method of claim 1, further comprising performing a dicing process on the second metal layer, the first metal layer, and the first IMD layer.

11. A semiconductor device, comprising:
    a substrate having a die region and a scribe line region defined thereon;
    a first inter-metal dielectric (IMD) layer on the substrate;
    a second IMD layer on the first IMD layer;
    a first metal layer on the second IMD layer, wherein the first metal layer covers a sidewall of the second IMD layer and extends to the scribe line region; and
    a second metal layer on the first metal layer.

12. The semiconductor device of claim 11, further comprising:
    a first via opening in the second IMD layer;
    the first metal layer on the second IMD layer and in the first via opening;
    a third IMD layer on the second IMD layer and the first metal layer;
    a second via opening in the third IMD layer;
    the second metal layer on the third IMD layer and in the second via opening; and
    a passivation layer on the third IMD layer and part of the second metal layer.

13. The semiconductor device of claim 12, wherein the first via opening is on the die region and the scribe line region.

14. The semiconductor device of claim 11, wherein the first metal layer overlaps the die region and the scribe line region.

15. The semiconductor device of claim 12, wherein second via opening is on the die region and the scribe line region.

16. The semiconductor device of claim 12, wherein the second metal layer overlaps the die region and the scribe line region for forming a bonding pad.

17. The semiconductor device of claim 16, wherein the second metal layer on the scribe line region contacts the first metal layer directly.

18. The semiconductor device of claim 16, wherein the depth between the top surface of the passivation layer and the top surface of the bonding pad overlapping the scribe line region is larger than 15 µm.

19. The semiconductor device of claim 16, wherein the distance of the bonding pad overlapping the scribe line region is larger than 150 µm.

* * * * *